United States Patent
Huang et al.

(10) Patent No.: US 11,981,998 B2
(45) Date of Patent: May 14, 2024

(54) SYSTEMS AND METHODS FOR SUBSTRATE SUPPORT TEMPERATURE CONTROL

(71) Applicant: Applied Materials, Inc., Santa Clara, CA (US)

(72) Inventors: Zubin Huang, Santa Clara, CA (US); Rui Cheng, San Jose, CA (US); Jian Li, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 820 days.

(21) Appl. No.: 17/085,255

(22) Filed: Oct. 30, 2020

(65) Prior Publication Data

US 2021/0130960 A1 May 6, 2021

Related U.S. Application Data

(60) Provisional application No. 62/930,249, filed on Nov. 4, 2019.

(51) Int. Cl.
*C23C 16/46* (2006.01)
*C23C 16/455* (2006.01)
(Continued)

(52) U.S. Cl.
CPC ...... *C23C 16/466* (2013.01); *C23C 16/45563* (2013.01); *C23C 16/4581* (2013.01); *H01J 37/32724* (2013.01)

(58) Field of Classification Search
CPC .......... C23C 16/45563; C23C 16/4581; C23C 16/4586; C23C 16/466; H01J 37/32724
(Continued)

(56) References Cited

U.S. PATENT DOCUMENTS

2003/0205324 A1* 11/2003 Keeton ............... H01L 21/6875
427/398.1
2010/0317917 A1 12/2010 DeLeon et al.
(Continued)

FOREIGN PATENT DOCUMENTS

CN 104254638 A 12/2014
JP 2009-144224 A 7/2009

OTHER PUBLICATIONS

Application No. PCT/US2020/058197, International Preliminary Report on Patentability, dated May 19, 2022, 7 pages.
(Continued)

*Primary Examiner* — Dana Ross
*Assistant Examiner* — James F Sims, III
(74) *Attorney, Agent, or Firm* — Kilpatrick Townsend & Stockton LLP

(57) ABSTRACT

Exemplary temperature modulation methods may include delivering a gas through a purge line extending within a substrate support. The gas may be directed to a backside surface of the substrate support opposite a substrate support surface. The purge line may extend along a central axis of a shaft, the shaft being hermetically sealed with the substrate support. The substrate support may be characterized by a center and a circumferential edge. A first end of the purge line may be fixed at a first distance from the backside surface of the substrate support. The methods may include flowing the gas at a first flow rate via a flow pathway to remove heat from the substrate support to achieve a desired substrate support temperature profile.

12 Claims, 5 Drawing Sheets

(51) Int. Cl.
*C23C 16/458* (2006.01)
*H01J 37/32* (2006.01)

(58) Field of Classification Search
USPC .................. 219/444.1; 427/374.1, 398.1
See application file for complete search history.

(56) References Cited

U.S. PATENT DOCUMENTS

| | | |
|---|---|---|
| 2013/0037532 A1 | 2/2013 | Volfovski et al. |
| 2015/0056787 A1 | 2/2015 | Brenninger |
| 2015/0194326 A1* | 7/2015 | Zhou ................. H01L 21/68792 |
| | | 156/345.48 |
| 2016/0093521 A1* | 3/2016 | Du Bois ................ H01L 21/68 |
| | | 438/795 |
| 2019/0103301 A1 | 4/2019 | Tashiro et al. |

OTHER PUBLICATIONS

International Search Report and Written Opinion dated Feb. 9, 2021 in International Patent Application No. PCT/US2020/058197, 8 pages.

* cited by examiner

SYSTEMS AND METHODS FOR SUBSTRATE SUPPORT TEMPERATURE CONTROL

CROSS REFERENCES TO RELATED APPLICATIONS

This application claims the benefit of priority to U.S. Patent Application No. 62/930,249 filed Nov. 4, 2019, the contents of which are hereby incorporated by reference in their entirety for all purposes.

TECHNICAL FIELD

The present technology relates to semiconductor deposition processes. More specifically, the present technology relates to systems and methods for modulating temperature profiles for substrate supports.

BACKGROUND

Integrated circuits are made possible by processes which produce intricately patterned material layers on substrate surfaces. Producing patterned material on a substrate requires controlled methods of formation and removal of exposed material. As device sizes continue to shrink, material uniformity may affect subsequent operations. For example, the temperature non-uniformity of a substrate heater may affect subsequent deposition film thickness uniformity.

Thus, there is a need for improved systems and methods that can be used to produce high quality devices and structures. These and other needs are addressed by the present technology.

SUMMARY

Exemplary temperature modulation methods may include delivering a gas through a purge line extending within a substrate support. The gas may be directed to a backside surface of the substrate support opposite a substrate support surface. The purge line may extend along a central axis of a shaft, the shaft being hermetically sealed with the substrate support. The substrate support may be characterized by a center and a circumferential edge. A first end of the purge line may be fixed at a first distance from the backside surface of the substrate support. The methods may include flowing the gas at a first flow rate via a flow pathway to remove heat from the substrate support to achieve a desired substrate support temperature profile.

In some embodiments, the flowing may include increasing the first flow rate to a second flow rate to decrease a temperature of the substrate support temperature profile. In some embodiments, the flowing may include decreasing the first flow rate to a second flow rate to increase a temperature of the substrate support temperature profile. Delivering the gas may include delivering the gas through a nozzle at the first end of the purge line. The nozzle may be configured to direct the gas to a first portion of the backside surface of the substrate support. The first portion may be characterized by a first diameter. The nozzle may be adjustable to a second diameter to direct gas to a second portion of the backside surface of the substrate support. The second portion may be characterized by a second diameter. The second diameter may be different than the first diameter. A substrate support temperature may maintained above or about 100° C. during a semiconductor process. The desired substrate support temperature profile may include a uniform temperature range deviating by at most about 1 degree Celsius at a central location during a semiconductor process. The first end of the purge line may be fixed at the first distance from the backside surface of the substrate support with a bracket. The first distance may be at most about 3 mm. The gas may be a high thermal conductivity gas. The gas may be chosen from at least one of helium, nitrogen, argon, and combinations thereof. Delivering the gas may include supplying the gas to the purge line at room temperature. Delivering the gas may include supplying a preheated gas to the purge line.

Some embodiments of the present technology may encompass a semiconductor processing chamber. The semiconductor processing chamber may include a substrate support. The substrate support may have a substrate support surface for contacting a substrate. The substrate support may be characterized by a central axis through the substrate support, a backside surface opposite the substrate support surface, and a circumferential edge connecting the substrate support surface and the backside surface. The substrate support may be disposed within a processing region of the semiconductor processing chamber. The semiconductor processing chamber may include a shaft about the central axis and hermetically sealed with the backside surface of the substrate support. The semiconductor processing chamber may include a purge line disposed concentrically within the shaft and about the central axis. The purge line may have a nozzle at a first end fixed at a first distance from the backside surface of the substrate support. The nozzle may be configured to deliver a high thermal conductivity gas to a first portion of the backside surface of the substrate support. The first portion may be characterized by a first diameter. The semiconductor processing chamber may include a flow pathway for convectively contacting the substrate support with the high thermal conductivity gas. The high thermal conductivity gas may be exhausted through the shaft to remove heat.

In some embodiments, the semiconductor processing chamber may include at least one of an RF line and an AC line. The nozzle may be adjustable to deliver the high thermal conductivity gas to a second portion of the backside surface of the substrate support. The second portion may be characterized by a second diameter. The second diameter may be different than the first diameter. The semiconductor processing chamber may include a gas supply configured to adjust the flow rate of the high thermal conductivity gas. The semiconductor processing chamber may include a thermocouple disposed within the purge line. The purge line may include a flexible material or a rigid material. The purge line may include a material chosen from stainless steel, aluminum, nylon, or combinations thereof. The substrate support may be or include a ceramic material. In some embodiments, the substrate support may be or include aluminum nitride.

Such technology may provide numerous benefits over conventional systems and techniques. For example, the processes may produce a substrate support characterized by a controlled temperature profile. Additionally, the operations of embodiments of the present technology may produce films characterized by a more uniform thickness. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
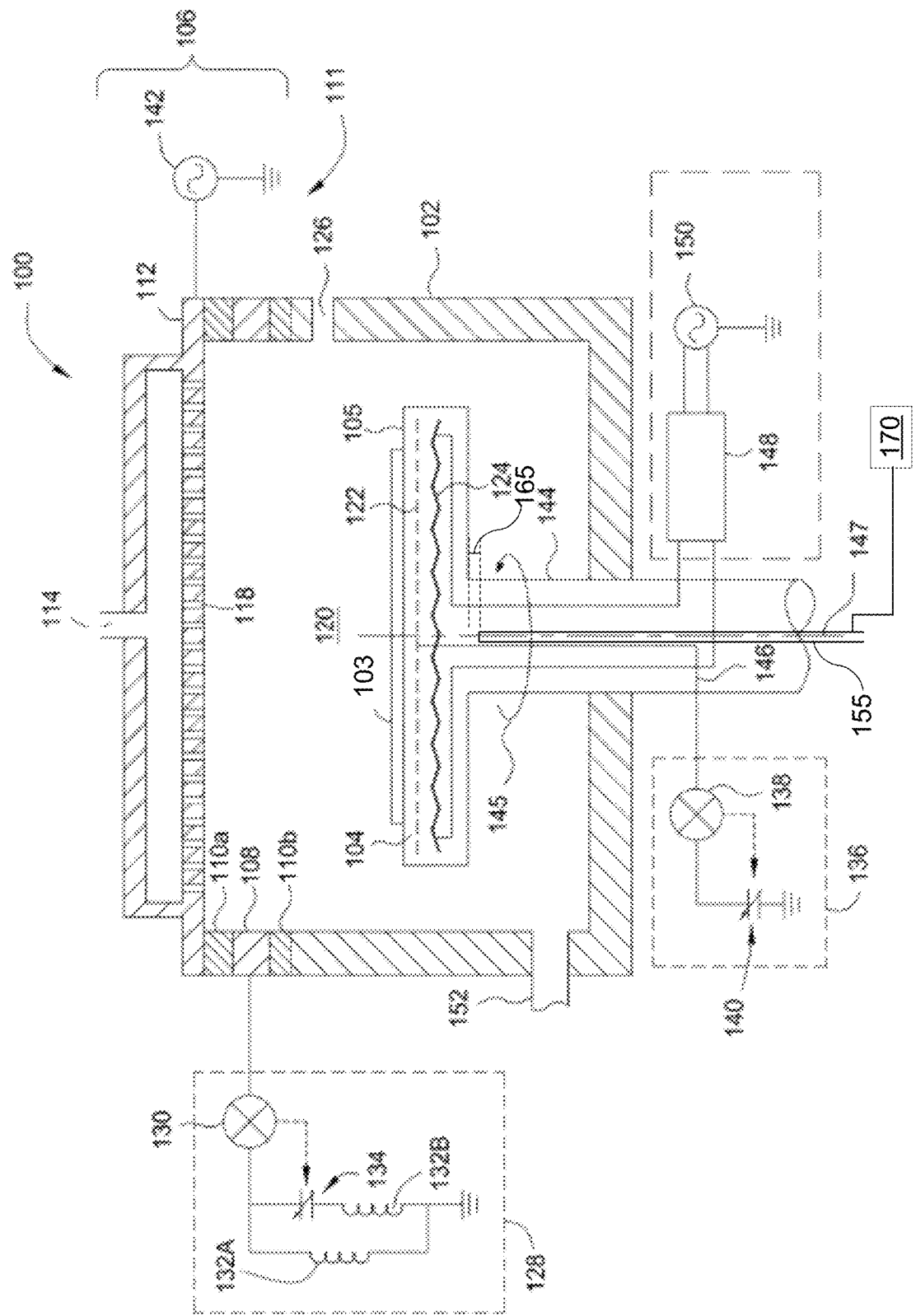
FIG. 1 shows a schematic cross-sectional view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During semiconductor fabrication, structures may be produced on a substrate utilizing a variety of deposition and etching operations. A substrate support may hold and heat the substrate for processing. The substrate support may be embedded with heating elements. Due to at least one of the substrate support construction, the substrate support materials, the heating elements, and the heating element design, a non-uniform temperature profile in the substrate support may result and lead to a substrate being deposited with a non-uniform film thickness during a deposition operation. For example, the substrate support materials, which may be a ceramic material such as aluminum nitride, may have non-uniform sintering during manufacture causing density non-uniformity from the center to the edge of the circular substrate support. As device sizes continue to reduce and film thicknesses on semiconductor substrates are on the nanometer scale or less, even small temperature differences within the substrate from the substrate support may influence film deposition onto the substrate. For example, temperature differences may be on the order of only a few degrees, such as less than five degrees Celsius or less, to have a deleterious effect on film thickness uniformity.

The present technology may overcome these limitations by modulating the temperature profile of the substrate support to provide a desired temperature profile for a substrate during the deposition. For example, the present technology may include providing a purge line within a pedestal shaft holding a substrate support to flow a gas directed to the substrate support during deposition. This may facilitate a more uniform temperature profile or a more controlled temperature profile, which may reduce or limit film thickness non-uniformity during deposition. Additionally, by controlling temperature at specific locations within the pedestal, such as at a center location, deposition characteristics, such as increased central deposition, may be better controlled. After describing general aspects of a chamber according to embodiments of the present technology in which plasma processing operations discussed below may be performed, specific methodology and component configurations may be discussed. It is to be understood that the present technology is not intended to be limited to the specific components and processing discussed, as the techniques described may be used to improve a number of film formation or removal processes, and may be applicable to a variety of processing chambers and operations.

FIG. 1 shows a cross-sectional view of an exemplary processing chamber 100 according to some embodiments of the present technology. The figure may illustrate an overview of a system incorporating one or more aspects of the present technology, and/or which may perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The shaft 144 of the substrate support 104 of FIG. 1 may further include a purge line 155 disposed at a distance 165 from the backside of substrate support 104. A gas may be fed to the substrate support 104 through purge line 155 from a gas supply 170. Additional details of purge line 155 or methods performed may be described further below.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
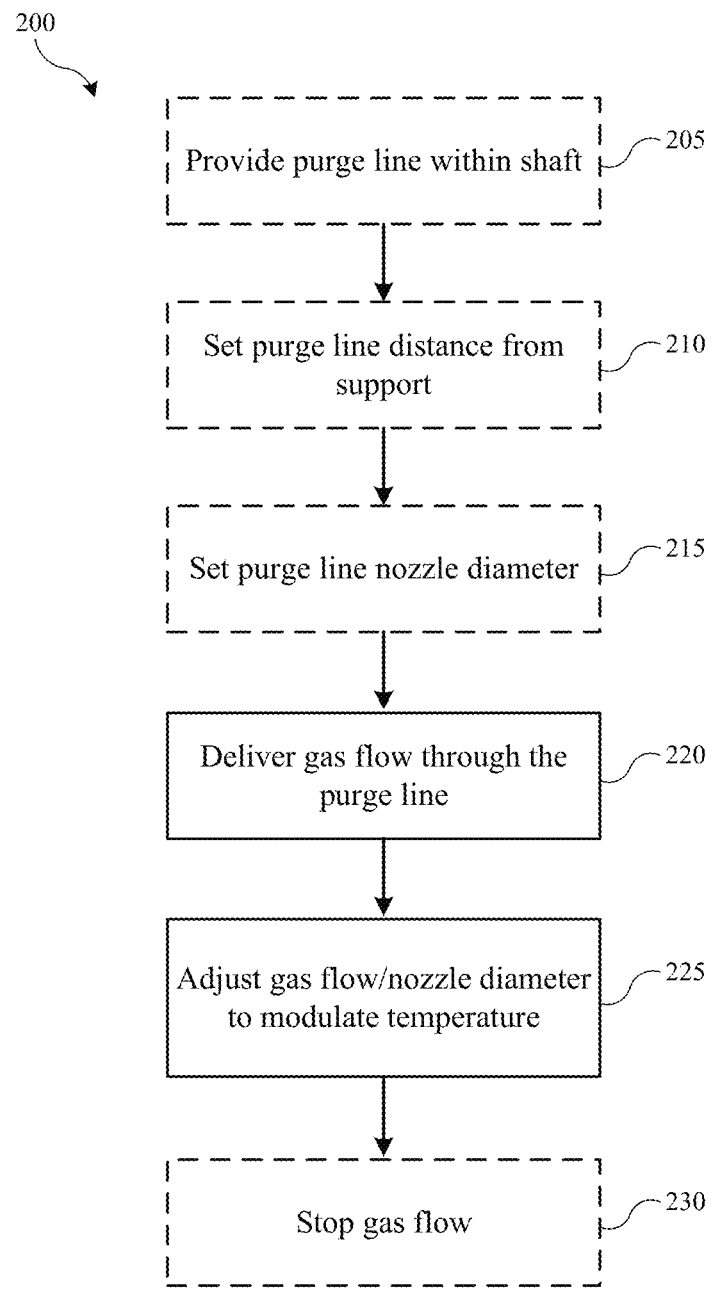
FIG. 2 shows exemplary operations in a temperature modulation method according to some embodiments of the present technology.

FIG. 2 shows exemplary operations in a temperature modulation method 200 according to some embodiments of the present technology. The method may be performed in a variety of processing chambers, including processing chamber 100 described above. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. Method 200 may describe operations shown schematically in FIGS. 3 and 5A-5E, the illustrations of which will be described in conjunction with the operations of method 200. It is to be understood that the figures illustrate only partial schematic views, and a substrate may contain any number of additional materials and features having a variety of characteristics and aspects as illustrated in the figures.

Figure 3:
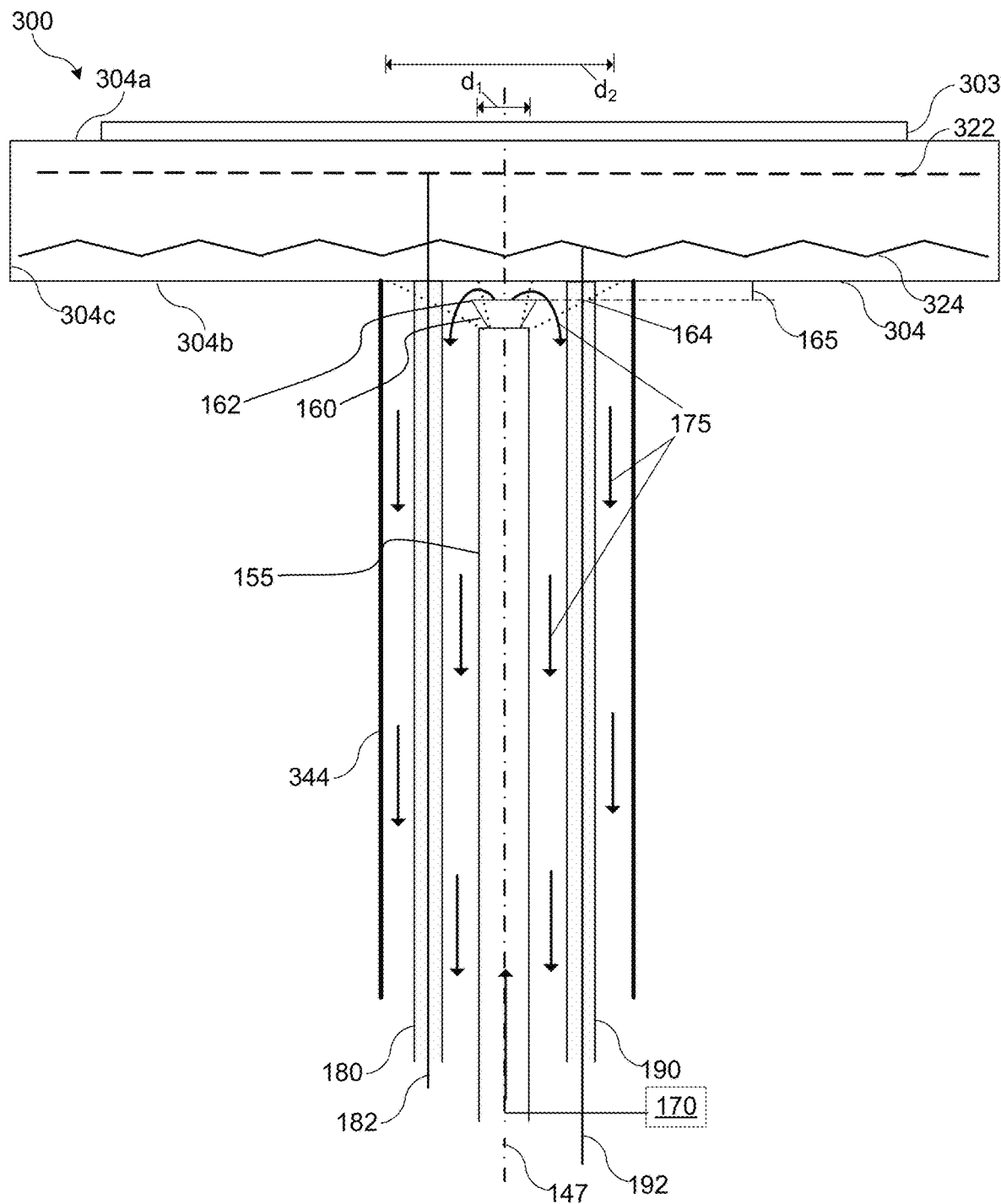
FIG. 3 shows a schematic view of a substrate support and shaft including a purge line according to some embodiments of the present technology.

Method 200 may include additional operations prior to initiation of the listed operations. For example, additional processing operations may include forming structures on a semiconductor substrate, which may include both forming and removing material. Prior processing operations may be performed in the chamber in which method 200 may be performed, or processing may be performed in one or more other processing chambers prior to delivering the substrate into the semiconductor processing chamber in which method 200 may be performed. Regardless, method 200 may optionally include delivering a semiconductor substrate to a processing region of a semiconductor processing chamber, such as processing chamber 100 described above, or other chambers that may include one or more components as described above. The substrate 103 may be deposited on a substrate support, which may be a pedestal such as substrate support 104, and which may reside in a processing region of the chamber, such as processing volume 120 described above. An exemplary substrate 303 is illustrated in FIG. 3 on substrate support 304 for substrate/support system 300.

The substrate support 304 may be any number of materials on which substrates may be disposed. The substrate support may be or include a ceramic material, for example oxides or nitrides. Suitable oxides may be or include aluminum oxide and suitable nitrides may be or include aluminum nitride or silicon nitride, and may further include metal materials, or any number of combinations of these materials, which may be the substrate support 304, or materials formed within or on substrate support 304. In some embodiments, substrate support 304 may include electrodes and/or heating elements embedded within the substrate support 304 for holding substrate 303. For example, as shown in FIG. 3, substrate support 304 may be embedded with electrode 322 and heating element 324. Electrode 322 may be coupled via conduit 182 to RF line 180 and heating element 324 may be coupled via conduit 192 to AC line 190. Substrate support 304 may include a substrate support surface 304a and a backside surface 304b opposite substrate support surface 304a. A circumferential edge 304c may connect substrate support surface 304a and backside surface 304b. A central axis 147 may extend through substrate support 304. The substrate support 304 may be rotatable along axis 147 and hermetically sealed to shaft 344.

At optional operation 205, such as during development of the pedestal or configuration within the chamber, a purge line 155 may be provided within shaft 344 and extending within substrate support 304. A gas may be flowed through purge line 155, which may direct the gas to the backside surface 304b. Purge line 155 may have a first end 162 and may include a nozzle 160 at the first end 162. In some embodiments a thermocouple may be disposed within the purge line. The purge line 155 may be or include a flexible material or a rigid material. The purge line may be or include a material chosen from stainless steel, aluminum, nylon, or combinations thereof, and rigidity provided may afford a more specific direction of flow, allowing a specific impingement of gas on a particular region of the backside of the puck. At optional operation 210, the first end 162 of purge line 155 may be set at a first distance 165 from the backside surface 304b of substrate support 304 to allow flow of gas to the backside 304b of substrate support 304. The distance 165 may be fixed by a bracket, which may be coupled to the shaft housing, or additional conduits extending through the shaft. For example, the first end 162 of purge line 155 may be fixed less than or about 3 mm from backside 304b of substrate support 304, less than or about 2 mm, less than or about 1 mm, or less. The distance of offset of the purge line may affect the size of a region of impact on the backside of the pedestal, which may determine a zone of affected temperature through the structure and substrate.

Some embodiments of the present technology may include setting a purge line nozzle 160 diameter at optional operation 215. Nozzle 160 may be adjustable to project a spray at varying trajectories. In some embodiments, the nozzle 160 may be adjusted to direct the gas to a first portion of the substrate support, the first portion having a first diameter $d_1$. In some embodiments, the nozzle 160 may be adjusted to direct the gas to a second portion of the substrate support, the second portion having a second diameter $d_2$. The diameter may be set to any number of settings continuously or incrementally to refine the temperature modulation of the substrate support 304, and the modulation may occur during processing in some embodiments.

Some embodiments of the present technology may include flowing a gas through the purge line 155 at operation 220. The gas may be delivered from a gas supply 170 and directed along axis 147 extending to first end 162 and out nozzle 160. The gas may be delivered or driven and may travel along a flow pathway 175. The gas may flow convectively such that the heat transfer of the gas may include the circulation of currents, represented by flow pathway 175. The flow pathway 175 may provide that the gas moves from gas supply 170 through the purge line 155 and toward the backside 304b of substrate support 304. The flow pathway 175 may provide that the gas then removes heat and exits through the shaft. The gas may be a high thermal conductivity gas. In some embodiments, the gas is chosen from at least one of helium, nitrogen, argon, and combinations thereof. Selection of a precursor may be performed based on a variety of variables. For example, although helium may be relatively more expensive than nitrogen or argon, the smaller molecule gas may provide improved heat transfer for a given volume delivered. Relatedly, nitrogen and argon may allow higher flow rates to be delivered as gas utilization may be more affordable, and velocity of delivery may provide an additional variable for tuning. The gas may be supplied to the purge line 155 at room temperature. Alternatively, delivering the gas may include supplying a preheated gas to the purge line 155 from gas supply 170.

For example, depending on the gas used, gas may be delivered to the purge line 155 at a flow rate less than or about 50 sccm, and may be delivered at a flow rate less than or about 40 sccm, less than or about 30 sccm, less than or about 20 sccm, less than or about 10 sccm, less than or about 9 sccm, less than or about 8 sccm, less than or about 7 sccm, less than or about 6 sccm, less than or about 5 sccm, or less. Similarly, helium, nitrogen, argon, or any other gas may be delivered to the purge line 155 at a flow rate less than or about 1,000 sccm, and may be delivered at a flow rate less than or about 800 sccm, less than or about 600 sccm, less than or about 500 sccm, less than or about 450 sccm, less than or about 400 sccm, less than or about 350 sccm, less than or about 300 sccm, less than or about 250 sccm, less than or about 200 sccm, or less. Any additional ranges within these ranges or as combinations of any stated or unstated number may also be used.

At operation 225, temperature modulation may be adjusted or fine-tuned to achieve a desired substrate support temperature profile, such as profiles shown schematically in FIGS. 5B-5E. In some embodiments, adjusting may include at least one of adjusting the gas flow rate and the nozzle diameter. For example, the gas flow rate may be increased for increased removal of heat to lower the substrate support 304 temperature or to effect a temperature reduction of the substrate support temperature profile at a region of impingement, and the gas flow rate may be decreased for decreased removal of heat to allow the substrate support temperature to rise. Nozzle 160 may be adjusted to direct the gas to at least a first or second portion of the substrate support, and the portions may be characterized as having different diameters, which may affect a smaller or larger area of the substrate support as needed. Adjusting the at least one of adjusting the gas flow rate and the nozzle diameter may be repeated as needed until the desired substrate support temperature profile is achieved. At optional operation 230, the gas flow may be halted. The gas flow may be stopped when a desired outcome is attained such a uniform film thickness is deposited onto the substrate the end of a deposition process, or the gas flow may be stopped when a desired substrate support temperature profile is attained. The stoppage of gas flow may be initiated by reducing the flow rate of the gas to zero, or by closing the nozzle 160 such as by closing a nozzle aperture, or by closing the gas feed from gas supply 170, or by a combination thereof.

Figure 4:
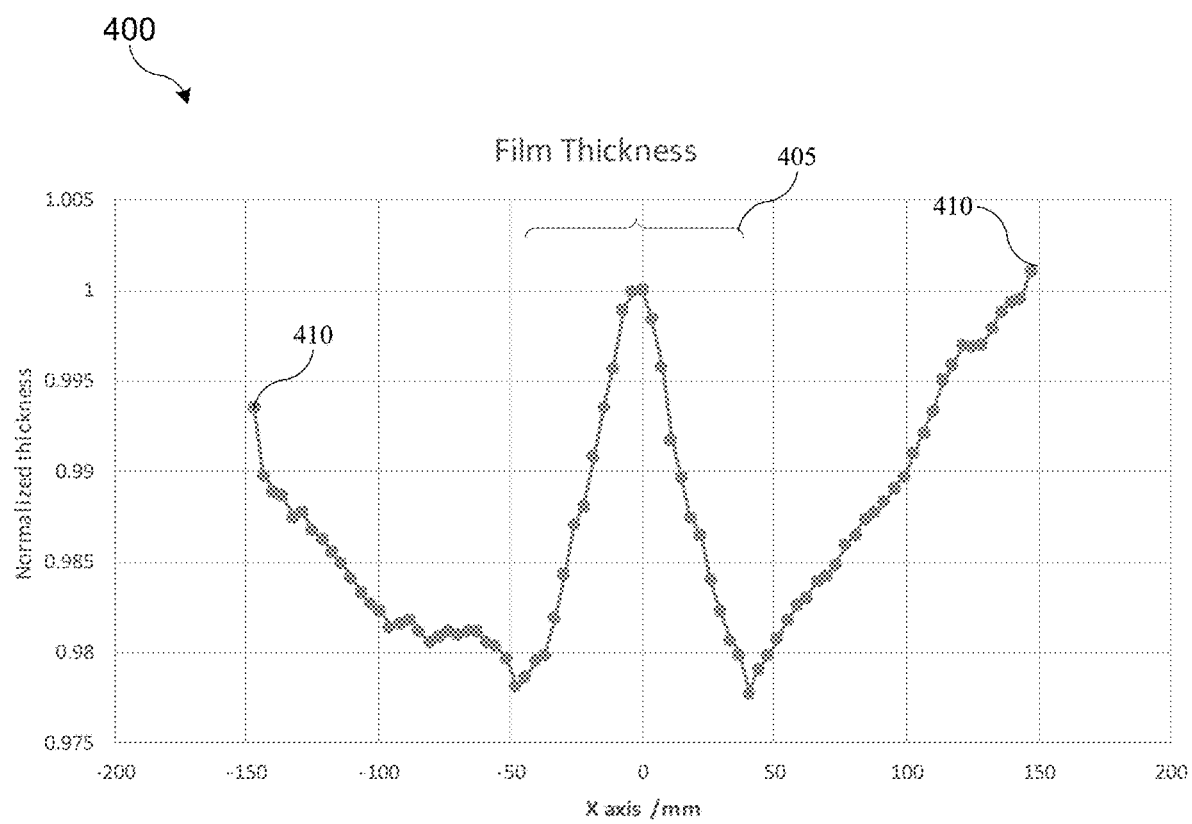
FIG. 4 shows a plot of film thickness using a conventional substrate support having a non-uniform temperature profile.

The temperature modulation method for a semiconductor substrate support of the present technology may result in a more uniform film deposited across a diameter of the substrate 303. In some embodiments, a normalized thickness, which may be produced at any specific film thickness, may be within less than or about 0.015, less than or about 0.010, less than or about 0.005, or less, from a highest, a lowest, or an average thickness of any location across the substrate. As a comparative example, as shown in FIG. 4, a conventional substrate support had a substrate disposed thereon, which was deposited with a film. The conventional substrate support had a non-uniform temperature profile where the central portion 405 of the substrate support, as well as the substrate support edges 410, exhibited a higher temperature. The resultant film thickness was also non-uniform with a thicker film thickness (normalized) corresponding to the central portion 405 and edges 410.

Figure 5A:
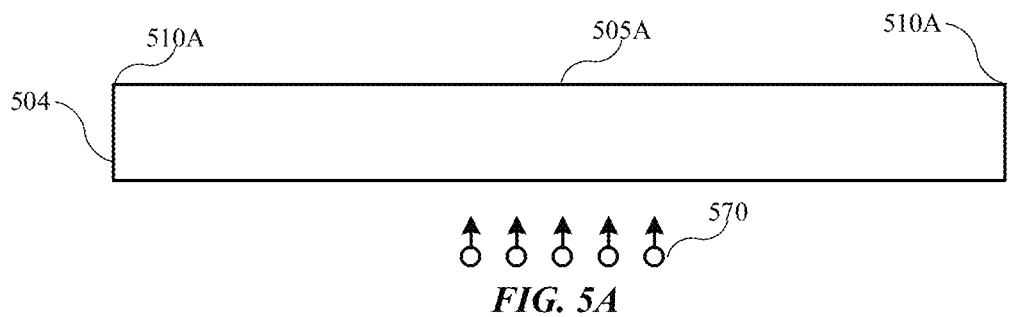
FIGS. 5A-5E show schematic views of exemplary temperature profiles for substrate supports according to some embodiments of the present technology.
Figure 5B:
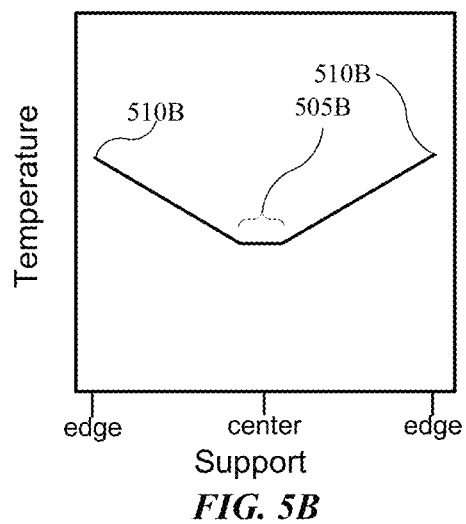
Figure 5C:
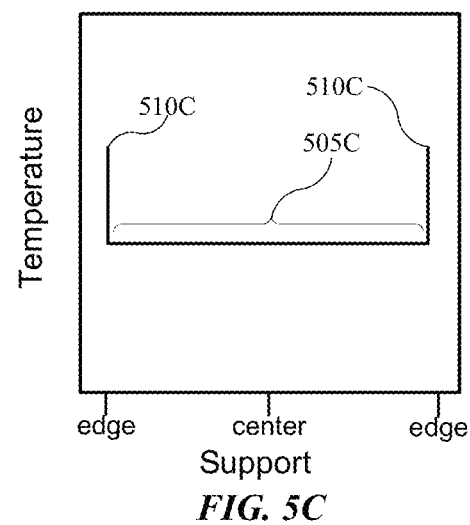
Figure 5D:
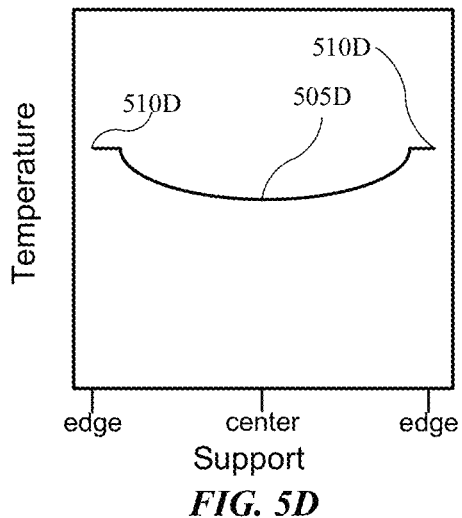
Figure 5E:
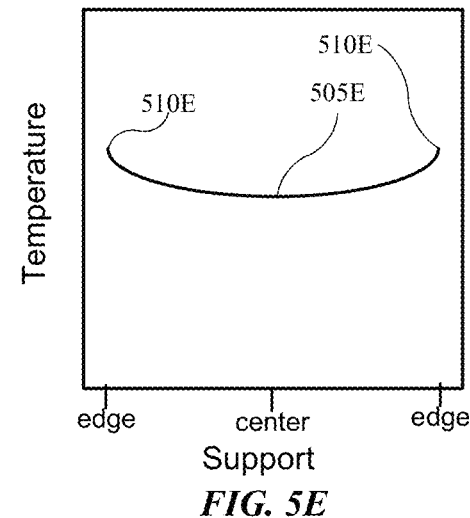

As illustrated schematically in FIG. 5A, gas 570 may be delivered to substrate 504 having a center 505A and edges 510A. The gas 570 may be delivered from a purge line as previously described. In some embodiments of modulation according to aspects of the present technology, a desired substrate support temperature profile may be achieved, non-limiting examples of which are shown in FIGS. 5B-5E. The example of FIG. 5B shows a substrate support temperature profile having a central portion 505B where the temperature may be lowest and gradually increases toward edges 510B. The example of FIG. 5C shows a substrate support temperature profile having a central portion 505C where the temperature may be constant extending through mid-regions of the substrate, and which may be lower than at the edges 510C. The example of FIG. 5D shows a substrate support temperature profile having a center 505D of a controlled profile where the temperature may be lower than at the edges 510D, but may be more controlled than a proportional change in temperature relative to distance, such as with profile illustrated in FIG. 5B, for example. Similarly, the example of FIG. 5E shows a substrate support temperature profile having a center 505E where a generally controlled profile extends from the center 505E having the lowest temperature gradually increasing to the edges 510E. It is to be understood that the temperature profiles illustrated in FIGS. 5B-5E are not intended to limit the present technology, but merely provide examples of gas delivery affects that may provide control over temperature, and thus deposition, across exemplary substrates.

The substrate support temperature may be maintained above or about 100° C. during a deposition process, and may be maintained at a temperature of greater than or about 120° C., greater than or about 140° C., greater than or about 160° C., greater than or about 180° C., greater than or about 200° C., greater than or about 220° C., greater than or about 240° C., greater than or about 260° C., greater than or about 280° C., greater than or about 300° C., greater than or about 320° C., greater than or about 340° C., greater than or about 360° C., greater than or about 380° C., greater than or about 400° C., greater than or about 420° C., greater than or about 440° C., greater than or about 460° C., greater than or about 480° C., greater than or about 500° C., or greater. The temperatures of the substrate may additionally impact the substrate support temperature profile. For example, in some embodiments the substrate may be maintained at a temperature of greater than or about 400° C., and may be maintained at a temperature of greater than or about 420° C., greater than or about 440° C., greater than or about 460° C., greater than or about 480° C., greater than or about 500° C., or greater.

A desired substrate support temperature profile may be one that produces a uniform temperature range during an operation such as a deposition process. In some embodiments, the uniform temperature range may be one that deviates less than or about 5 degrees Celsius from the target substrate support temperature, and may deviate less than or about 4 degrees Celsius, less than or about 3 degrees Celsius, less than or about 2 degrees Celsius, less than or about 1 degrees Celsius, less than or about 0.5 degrees Celsius, or less. Additionally, the gas delivery may allow a location at a surface of the substrate support on which the substrate may reside to be adjusted relative to any other location along the substrate, or may allow a gradient to be produced across the support or substrate as described above. For example, a localized temperature, such as at a wafer center in line with a gas impingement position on the support, may be reduced relative to a position radially outward from the gas impingement location, such as at a half radius, edge location, or any other location, with a temperature range of less than or about 5° C., which may correspond to a similar reduction in temperature at a gas impingement location on the substrate support, relative to a temperature throughout the rest of the support for example.

In some embodiments, the localized temperature may be controlled to deviate from other pedestal location temperatures by less than or about 4° C., less than or about 3° C., less than or about 2° C., less than or about 1° C., less than or about 0.8° C., less than or about 0.6° C., less than or about 0.5° C., less than or about 0.4° C., less than or about 0.3° C., less than or about 0.2° C., less than or about 0.1° C., or less, depending on the desired temperature reduction. Similarly, a temperature gradient may be produced across the substrate support characterized by any of the profiles discussed above, which may provide a center to edge temperature difference, either linearly or along a parabolic or other profile, of less than or about 10° C., and may provide a temperature gradient of less than or about 10° C., less than or about 10° C., less than or about 10° C., less than or about 10° C., less than or about 10° C., less than or about 10° C., less than or about 10° C., less than or about 10° C., less than or about 10° C., less than or about 10° C., or less. Any smaller range encompassed by any of these ranges, and which may provide a specific central temperature reduction to reduce deposition in a particular location, such as at a central region, is similarly encompassed.

The gas delivery may also provide a temperature reduction of any temperature stated or encompassed elsewhere at a range to positioned from a center of the substrate. For example, the temperature may be reduced by any temperature at a radius of less than or about 25 mm from a central axis through the substrate support, or gas delivery channel, and may be reduced at a location characterized by a radius from the central axis of less than or about 20 mm, less than or about 15 mm, less than or about 10 mm, less than or about 9 mm, less than or about 8 mm, less than or about 7 mm, less than or about 6 mm, less than or about 5 mm, less than or about 4 mm, less than or about 3 mm, less than or about 2 mm, less than or about 1 mm, or less. By providing a centrally delivered gas within the pedestal, center deposition profiles may be controlled to provide more uniform deposition across a substrate according to embodiments of the present technology.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a gas" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A temperature modulation method for a semiconductor substrate support comprising:
   delivering a gas through a purge line extending within a semiconductor substrate support, the gas directed to a backside surface of the semiconductor substrate support opposite a semiconductor substrate support surface, wherein the purge line extends along a central axis of a shaft, wherein the shaft is hermetically sealed with the semiconductor substrate support, wherein the semiconductor substrate support is characterized by a center and a circumferential edge, and wherein a first end of the purge line is fixed at a first distance from the backside surface of the semiconductor substrate support; and
   flowing the gas convectively at a first flow rate via a flow pathway to remove heat from the semiconductor substrate support to achieve a desired semiconductor substrate support temperature profile.

2. The modulation method of claim 1, wherein flowing includes one of:
   increasing the first flow rate to a second flow rate to provide a temperature reduction of the semiconductor substrate support temperature profile; and
   decreasing the first flow rate to a third flow rate to provide a temperature increase of the semiconductor substrate support temperature profile.

3. The modulation method of claim 1, wherein delivering the gas includes delivering the gas through a nozzle at the first end of the purge line, the nozzle configured to direct the gas to a first portion of the backside surface of the semiconductor substrate support, wherein the first portion is characterized by a first diameter.

4. The modulation method of claim 3, wherein the nozzle is adjustable to a second diameter to direct gas to a second portion of the backside surface of the semiconductor substrate support, wherein the second portion is characterized by a second diameter different than the first diameter.

5. The modulation method of claim 1, wherein a semiconductor substrate support temperature is maintained above or about 100° C. during a semiconductor process.

6. The modulation method of claim 1, wherein the desired semiconductor substrate support temperature profile includes a uniform temperature range deviating by at most about 1 degree Celsius at a central location during a semiconductor process.

7. The modulation method of claim 1, wherein the first end of the purge line is fixed at the first distance from the backside surface of the semiconductor substrate support with a bracket, and the first distance is at most about 3 mm.

8. The modulation method of claim 1, wherein the gas is a high thermal conductivity gas.

9. The modulation method of claim 1, wherein the gas is chosen from at least one of helium, nitrogen, argon, and combinations thereof.

10. The modulation method of claim 1, wherein delivering the gas includes supplying the gas to the purge line at room temperature.

11. The modulation method of claim 1, wherein delivering the gas includes supplying a preheated gas to the purge line.

12. The modulation method of claim 1, wherein the flow pathway extends through the purge line toward the backside of the semiconductor substrate support and through the shaft away from the backside of the semiconductor substrate support.

* * * * *